(12) United States Patent
Maehara et al.

(10) Patent No.: US 8,151,456 B2
(45) Date of Patent: Apr. 10, 2012

(54) METHOD OF PRODUCING SUBSTRATE

(75) Inventors: Yasutomo Maehara, Kawasaki (JP);
Kenji Iida, Kawasaki (JP); Tomoyuki Abe, Kawasaki (JP); Shin Hirano, Kawasaki (JP); Takashi Nakagawa, Kawasaki (JP); Hideaki Yoshimura, Kawasaki (JP); Seigo Yamawaki, Kawasaki (JP); Norikazu Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 735 days.

(21) Appl. No.: 12/175,732

(22) Filed: Jul. 18, 2008

(65) Prior Publication Data

US 2009/0094825 A1     Apr. 16, 2009

(30) Foreign Application Priority Data

Oct. 12, 2007   (JP) ................................ 2007-267179

(51) Int. Cl.
*H05K 3/02* (2006.01)
*H05K 3/40* (2006.01)
*H05K 3/42* (2006.01)

(52) U.S. Cl. .............. 29/852; 29/830; 29/847; 174/255; 174/262; 205/125; 205/126; 427/99.5; 427/97.7

(58) Field of Classification Search .................... 29/852, 29/830–831, 846–847; 174/255, 262–264; 205/125, 126; 427/99.5, 97.7
See application file for complete search history.

(56) References Cited

U.S. PATENT DOCUMENTS

| 4,705,592 | A  | * | 11/1987 | Bahrle et al. ..................... 216/18 |
| 5,129,142 | A  | * | 7/1992  | Bindra et al. ................... 29/852 |
| 5,153,987 | A  | * | 10/1992 | Takahashi et al. .............. 29/852 |
| 5,949,030 | A  |   | 9/1999  | Fasano et al. |
| 6,459,046 | B1 | * | 10/2002 | Ochi et al. ..................... 174/256 |
| 6,722,031 | B2 | * | 4/2004  | Japp et al. ........................ 29/852 |
| 7,224,046 | B2 | * | 5/2007  | Abe et al. ...................... 257/668 |
| 7,415,761 | B2 | * | 8/2008  | Hirose et al. .................... 29/852 |
| 7,435,352 | B2 | * | 10/2008 | Mok et al. ........................ 216/13 |
| 7,603,772 | B2 | * | 10/2009 | Farnworth et al. .............. 29/852 |

(Continued)

FOREIGN PATENT DOCUMENTS

JP       4-120791       4/1992

(Continued)

OTHER PUBLICATIONS

Korean Office Action issued on Nov. 26, 2010 in corresponding Korean Patent Application 10-2008-0077434.

(Continued)

*Primary Examiner* — Derris Banks
*Assistant Examiner* — Kaying Kue
(74) *Attorney, Agent, or Firm* — Staas & Halsey LLP

(57) ABSTRACT

The method of producing a substrate comprises the steps of: forming a through-hole in a base member; plating the base member so as to coat an inner face of the through-hole with a plated layer; applying photo resist on the base member; optically exposing and developing the photo resist so as to form a resist pattern, which coats at least a planar area of the through-hole; and etching an electrically conductive layer formed on the surface of the base member. The resist pattern is formed so as to separate an area of exposing the conductive layer a prescribed distance away from an edge of the through-hole, and the prescribed length is longer than a distance of etching a side face of the conductive layer in the etching step.

5 Claims, 7 Drawing Sheets

U.S. PATENT DOCUMENTS

| | | | |
|---|---|---|---|
| 7,832,098 B2 * | 11/2010 | Hirose et al. | 29/852 |
| 2004/0194303 A1 * | 10/2004 | Kim et al. | 29/852 |
| 2006/0029726 A1 * | 2/2006 | Mok et al. | 427/96.1 |
| 2007/0169343 A1 * | 7/2007 | Farnworth et al. | 29/847 |

FOREIGN PATENT DOCUMENTS

| | | |
|---|---|---|
| JP | 6-81172 | 3/1994 |
| JP | 2001-203458 | 7/2001 |
| JP | 2001-210952 | 8/2001 |
| JP | 2002-64160 | 2/2002 |
| JP | 2004-119691 | 4/2004 |
| JP | 2006-222216 | 8/2006 |
| JP | 2007-142348 | 6/2007 |
| KR | 1999-0044871 | 6/1999 |
| KR | 10-2004-0027326 | 4/2004 |
| KR | 10-0722615 | 5/2007 |
| WO | 2004/064467 | 7/2004 |

OTHER PUBLICATIONS

Office Action mailed form the Japanese Patent Office on Jan. 17, 2012 in the corresponding Japanese patent application No. 2007-267179.

* cited by examiner

FID.5D

METHOD OF PRODUCING SUBSTRATE

BACKGROUND OF THE INVENTION

The present invention relates to a method of producing a substrate having an electrically conductive core section for forming a circuit board, etc., especially relates to a method including a step of coating an inner face of a through-hole formed in a base member with a plated layer.

Some test substrates, which are used for testing circuit boards, on which semiconductor elements will be mounted, and semiconductor wafers, include core substrates composed of carbon fiber-reinforced plastic (CFRP). In comparison with conventional glass-epoxy core substrates, thermal expansion coefficients of the core substrates composed of carbon fiber-reinforced plastic are small, and thermal expansion coefficients of the circuit boards having such core substrates can be corresponded to those of semiconductor elements to be mounted on the circuit boards. Therefore, thermal stress generated between a semiconductor element and a circuit board can be effectively avoided.

The circuit board is formed by laminating cable layers on the both side faces of the core substrate, and plated through-hole (PTH) sections are formed in the core substrate so as to mutually electrically connect the cable layers on the both side faces thereof. The plated through-hole sections are formed by boring through-holes in a substrate and forming plated layers (electrically conductive parts) on inner faces of the through-holes.

In case of the base member having the electrically conductive core section composed of, for example, carbon fiber-reinforced plastic, if the plated through-hole sections are formed by merely boring the through-holes and plating the inner faces thereof, the plated through-hole sections and the core section are electrically shorted. Thus, the plated through-hole sections are formed in the core substrate having the electrically conductive core section by the steps of: forming pilot holes, whose diameters are greater than those of the plated through-hole sections to be formed, in the base member; filling the pilot holes with insulating resin; and forming the plated through-hole sections in the filled through-holes. With this method, the plated through-hole sections and the core section are not electrically shorted (see JP Kohyo Gazette No. 2004/064467, JP Patent Gazette No. 2006-222216).

However, if the pilot holes are drilled, burrs are formed on inner faces of the pilot holes and the plated through-hole sections and the core section will be electrically shorted. To solve this problem, the inner faces of the pilot holes are coated with insulating layers so as not to electrically short the plated through-holes and the core section (see JP Patent Gazette No. 2006-222216). However, it is difficult to perfectly coat the rough inner faces of the pilot holes.

The core substrate is formed by laminating cable layers on the both side faces of a core section. If the core section is composed of a material having a small thermal expansion coefficient, e.g., carbon fiber-reinforced plastic, great heat stresses work to boundary faces between the core section and the cable layers because the thermal expansion coefficients of the cable layers are much greater than that of the core section. By the great heat stresses, the cable layers will be separated from the core section or cracks will be formed therebetween. To avoid the problem, bonding strength between the core section and the cable layers must be increased.

As described above, in case of forming the plated through-hole sections in the core substrate having the conductive core section, through-holes are formed in the substrate, and then inner faces of the through-holes are plated for electric connection. In this case, the plated layers must be protected to secure the electric connection of the plated layers.

SUMMARY OF THE INVENTION

The present invention was conceived to solve the above described problems.

An object of the present invention is to provide a suitable method of producing a substrate, which is capable of protecting a plated layer coating an inner face of a through-hole formed in the substrate.

To achieve the object, the present invention has following constitutions.

Namely, the method of producing a substrate of the present invention comprises the steps of: forming a through-hole in a base member; plating the base member so as to coat an inner face of the through-hole with a plated layer; applying photo resist on a surface of the base member; optically exposing and developing the photo resist so as to form a resist pattern, which coats at least a planar area of the through-hole; and etching an electrically conductive layer formed on the surface of the base member with using the resist pattern as a mask, and the resist pattern is formed, in said applying step, so as to separate an area of exposing the conductive layer a prescribed distance away from an edge of the through-hole, and the prescribed distance is longer than a distance of etching a side face of the conductive layer in said etching step.

Note that, the steps of forming the through-hole in the base member and forming the conductive layer (plated layer) on the inner face of the through-hole are often performed in conventional methods of producing circuit boards. In the method of the present invention, the etching step is performed without damaging the plated layer coating the inner face of the through-hole when the conductive layer formed on the surface of the base member is etched, after forming the plated layer on the inner face of the through-hole, so as to pattern the conductive layer in the prescribed pattern.

In the method, the base member may have an electrically conductive core section; the through-hole may be a pilot hole for forming a plated through-hole section penetrating the pilot hole; and the inner hole of the pilot hole may be coated with the plated layer.

In the method, the inner face of the pilot hole may be coated with the plated layer, the pilot hole may be filled with an insulating material, and then the photo resist may be applied on the surface of the base member whose pilot hole has been filled with the insulating material; the photo resist may be optically exposed and developed so as to form the resist pattern, which coats at least a planar area of the pilot hole filled with the insulating material; the conductive layer formed on the surface of the base member may be etched with using the resist pattern as the mask; and the resist pattern may be formed, in said applying step, so as to separate the area of exposing the conductive layer a prescribed distance away from the edge of the pilot hole, and the prescribed distance may be longer than the distance of etching the side face of the conductive layer in said etching step. With this method, the plated layer coating the inner face of the pilot hole is not damaged in the etching step, and adhesiveness between the base member and the cable layer laminated thereon can be improved by etching the conductive layer on the surface of the base member in the prescribed pattern.

In the method, the photo resist may be patterned, in the exposing and developing step, along the edge of the pilot hole so as to form a ring-shaped coating pattern, so that a ring-shaped land can be formed along the edge of the pilot hole.

By coating the inner face of the pilot hole with the plated layer, short circuit between the plated through-hole section and the core section can be prevented when the plate through-hole section is formed in the pilot hole.

In the method, the inner face of the pilot hole may be coated with an insulating film by an electrodeposition method, in which the plated layer is used as an electric power feeding layer, after plating the inner face of the pilot hole with the plated layer; and the pilot hole, whose inner face is coated with the insulating film, may be filled with the insulating material, so that the short circuit between the plated through-hole section and the core section can be securely prevented. In case of coating the inner face of the pilot hole with the insulating film by the method of the present invention, damaging the plated layer coating the inner face of the pilot hole can be further prevented.

In the method, electroless plating for coating the surface of the base member may be performed after filling the pilot hole with the insulating material; and the photo resist may be applied on the surface of the base member, on which an electroless-plated layer has been formed, so as to form the resist pattern, so that the resist pattern can be easily removed from the insulating material filling the pilot hole in the step of removing the resist pattern.

In the method, cable layers may be laminated on the both side faces of the core section after etching the conductive layers and removing the resist patterns; a through-hole passing through the pilot hole may be formed; and an inner face of the through-hole may be coated with a plated layer so as to form a plated through-hole section.

In the method, the through-hole may be filled with an insulating material after forming the plated through-hole section; and the conductive layers formed on the side faces of the base member may be etched to form into prescribed patterns so that cable patterns formed on the both side faces of the base member can be electrically connected by the plated through-hole section.

In the method, cable layers may be laminated on the both side faces of the base member so as to produce a circuit board, so that the circuit board, in which the cable layers are laminated on the both side faces of the substrate can be produced.

The cable layers of the circuit board may be laminated on the both side faces of the substrate by a build-up method.

In the method, the core section may be formed into a flat plate by heating and pressurizing a plurality of prepregs including carbon fibers, so that a thermal coefficient of the substrate can be corresponded to that of a semiconductor element to be mounted thereon, and a circuit board having high reliability can be produced.

In the method of the present invention, damaging the plated layer coating the inner face of the through-hole can be prevented while etching the conductive layer formed on the surface of the base member, so that a function of the plated layer coating the inner face of the through-hole can be secured. By etching the conductive layer formed on the surface of the base member in the prescribed pattern, the adhesiveness between the base member and the cable layer can be increased, so that separating the cable layer from the base member and forming cracks in a boundary surface therebetween can be prevented even if the thermal expansion coefficients between the two are not corresponded.

BRIEF DESCRIPTION OF THE DRAWINGS

Embodiments of the present invention will now be described by way of examples and with reference to the accompanying drawings, in which:

FIGS. 5A-5D are partial sectional views showing the steps of etching conductive layers formed on the both side faces of the base member;

DETAILED DESCRIPTION OF THE EMBODIMENTS

Preferred embodiments of the present invention will now be described in detail with reference to the accompanying drawings.

(Steps of Forming Core Substrate)

In the following description, a method of producing a core substrate, which has a base member including an electrically conductive core section, will be explained as embodiments of the present invention.

FIGS. 1A-2B show the steps of: forming pilot holes, through which plated through-hole sections will be respectively pierced, in a base member; forming gas purging holes; and filling the pilot holes with insulating materials.

Figure 1A:
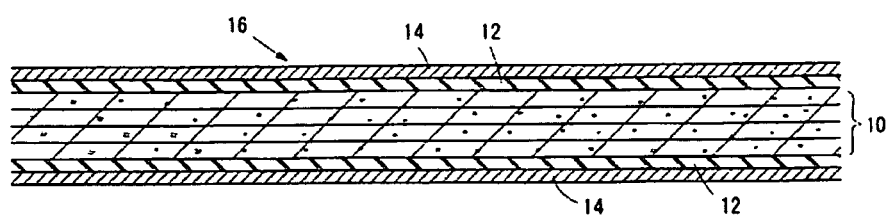
FIGS. 1A-1D are partial sectional views showing the steps of forming pilot holes and gas purging holes in a base member.

FIG. 1A shows a flat plate-shaped base member 16, which comprises a core section 10 composed of carbon fiber-reinforced plastic and copper foils 14 respectively bonded on the both side faces of the core section 10 with prepregs 12. The core section 10 is formed by the steps of: laminating four prepregs, each of which is formed by impregnating a carbon cloth with polymer, e.g., epoxy resin; and heating and pressurizing the laminated prepregs so as to integrate them. Note that, number of the laminated prepregs including carbon fibers, which constitute the core section 10, can be optionally selected.

In the present embodiment, the core section 10 is constituted by woven carbon fiber cloths, each of which is composed of carbon fiber filaments. Further, unwoven carbon fiber cloths, carbon fiber meshes, etc. may be used instead of the woven carbon fiber cloth. Thermal expansion coefficients of carbon fibers are about 0 ppm/° C., and a thermal expansion coefficient of the core section 10 can be adjusted by selecting: a rate of content of carbon fibers in the carbon fiber-reinforced plastic; resin materials included in the carbon fibers; fillers mixed with the resin, etc. In the present embodiment, the thermal expansion coefficients of the core section 10 is about 1 ppm/° C.

A thermal expansion coefficient of the entire base member having the core section 10 composed of the carbon fiber-reinforced plastic can be adjusted by selecting thermal expansion coefficients of cable layers, which constitute the base member, and insulating layers, which are provided between the cable layers. Further, a thermal expansion coefficient of a circuit board, which is formed by laminating build-up layers on the both side faces of the base member, can be properly adjusted by selecting thermal expansion coefficients of the base member and the build-up layers. Thermal expansion coefficients of semiconductor elements are about 3.5 ppm/° C. Thermal expansion coefficients of the circuit board can be easily corresponded to that of semiconductor elements to be mounted on the circuit board.

Figure 1B:
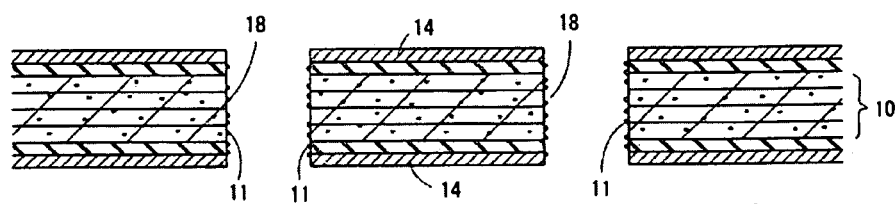
Figure 1C:
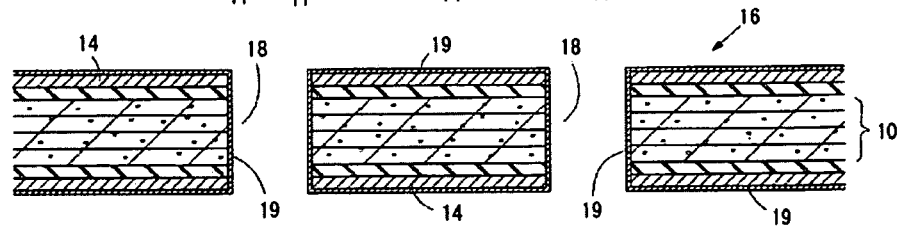

In FIG. 1B, pilot holes 18 are bored in the base member 16. The pilot holes 18 are through-holes, which are bored in the thickness direction of the base member 16 by a drill. Diameters of the pilot holes are greater than those of through-holes of plated through-hole sections, which will be formed in the following step. In the present embodiment, the diameters of the pilot holes 18 are 0.8 mm; the diameters of the through-holes of the plated through-hole sections are 0.35 mm. The pilot holes 18 are located at prescribed planar positions, which correspond to the plated through-hole sections to be formed in the base member.

When the pilot holes 18 are drilled, burrs are formed on inner faces of the pilot holes 18 due to, for example, abrasion of the drill, and the pilot holes 18 have rough or uneven inner faces. Further, drill dusts of the core section 10 will stick on the inner faces of the pilot holes 18.

In case of the core section 10 composed of carbon fiber-reinforced plastic, carbon dusts 11 stick on the inner faces of the pilot holes 18. The carbon dusts 11 have electric conductivity, so if the carbon dusts 11 invade into resin 20 filling the pilot holes 18, the insulation performance of the resin 20 is worsened. Further, the plated through-hole section and the core section 10 will be electrically shorted.

To prevent the short circuit between the plated through-hole sections and the core section 10, in the present embodiment, electroless copper plating and electrolytic copper plating are performed in this order after forming the pilot holes 18 in the base member 16 so as to coat the inner faces of the pilot holes 18 with copper plated layers 19. By electroless-plating the base member 16 with copper, the copper layer is formed on the entire inner faces of the pilot holes 18 and the entire side faces of the base member 16. Then, the electrolytic plating is performed with using the copper layer as an electric power feeding layer, so that the plated layers 19 can be formed on the inner faces of the pilot holes 18 and the both side faces of the base member 16 (see FIG. 1C). A thickness of the copper layer formed by the electroless plating is about 0.5 μm; thicknesses of the plated layers 19 formed by the electrolytic plating are about 10-20 μm.

By coating the inner faces of the pilot holes 18, the inner faces of the pilot holes 18 are made smooth, so that the pilot holes 18 can be easily filled with the resin 20 without forming voids. Therefore, the plated through-hole sections 20 and the core section 10 are not shorted at positions corresponding to voids. Further, the dusts 11 stuck on the inner faces of the pilot holes 18 are encompassed by or embedded in the plated layers 19, so that no dusts 11 are peeled from the inner faces thereof. With this structure, insulating performance of the resin 20 can be secured.

In the step of filling the pilot holes 18 with the resin 20, a heat treatment is performed so as to cure the resin 20, so a decomposition gas is generated from a plastic component of the core section 10 or moisture absorbed in the core section 10 is vaporized.

The decomposition gas and the water vapor, which are generated during the heat-curing step, move to exit from the core section 10, but the plated layers 19 coat the entire surfaces of the core section including the inner faces of the pilot holes 18. With this structure, the gas and the water vapor cannot exit therefrom, thus they expand the plated layers 19 coating the inner faces of the pilot holes and the copper foils 14 and the plated layers 19 coating the side faces of the base member 16. A purpose of forming the plated layer 19 is to coat the inner faces of the pilot holes 18 and make them smooth. If the plated layers 19 are expanded, the purpose cannot be achieved.

The structure of entirely coating the surfaces of the base member 16 including the inner faces of the pilot holes 18 with the plated layers 19 and the copper foils 14 causes the above described problem when the step of heat-curing the resin 20 in the pilot holes 18 is performed. Further, the structure causes the same problem when cable layers are formed on the both side faces of the base member 16 by heating and pressurizing cable sheets with prepregs.

In case of producing a circuit board by forming build-up layers on the both side faces of the base member 16, the process of forming the build-up layers includes heating steps, so the problem of expanding the copper foils 14 and the plated layers 19, which is caused by the gas generated from the core section 10 or the base member 16, will occur.

Thus, in the method of the present embodiment, gas purging holes 140 are formed in the surfaces of the base member 16 so as to securely form paths for discharging or purging the decomposition gas generated from the core section 10 and/or water vapor generated from the base member 16.

Figure 1D:
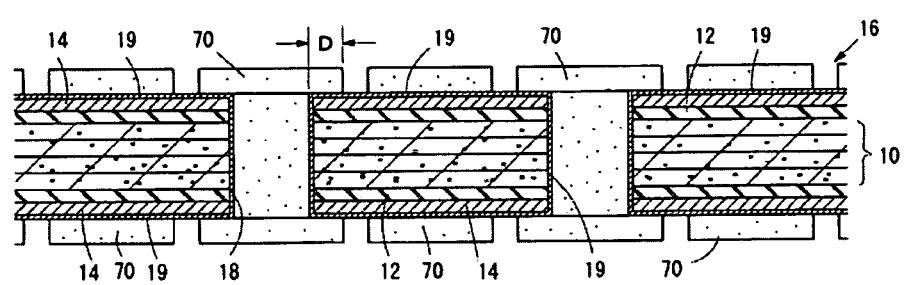

In FIG. 1D, dry film resist (photo resist) is applied on the both side faces of the base member 16, and then the photo resist is patterned to form resist patterns 70, in which parts corresponding to the gas purging holes 140 to be formed are exposed, by optically exposing and developing the photo resist, so as to form the gas purging holes 140 in the both side faces of the resist 16.

By forming the gas purging holes 140, the copper foils 14 coating the side faces of the base member 16 and the plated layers 19 laminating on the copper foils 14 are partially bored, so that the surfaces of the prepregs 12 coating the core section 10 are exposed so as to communicate the core section 10 to the outside.

Positions and sizes of the gas purging holes 14 may be optionally selected. In the present embodiment, the gas purging holes 140 are located near the pilot holes 18 so as to prevent expansion of the plated layers 19 on the inner faces of the pilot holes 18.

In the present embodiment, a separation D between the gas purging hole 10 and the edge of the pilot hole 18 is 300-350 μm. When the gas purging holes 140 are formed, amount of etching side faces of the gas purging holes 140 depends on thicknesses of the plated layers 19 and the copper foils 14, etching conditions, e.g., etching solution, etc. Therefore, the positions of the gas purging holes 140 may be designed on the basis of the amount of etching the side faces of the gas purging holes 140.

Etching the side faces is caused, by invasion of the etching solution, when the copper foils 14 and the plated layers 19 on the surfaces of the base member 16 are etched with using the resist patterns 70 as the masks, and the amount of etching the side face is varied by etching conditions, e.g., thicknesses of the copper foils 14 and the plated layers 19, etching solution, injecting pressure of the etching solution. When the resist patterns are designed, the distance D may be set so as to prevent the etching solution from reaching the inner faces of the pilot holes 18.

In the present embodiment, the resist patterns 70 are formed so as to separate areas of exposing the plated layers 19, which are formed on the surfaces of the base member 16, a prescribed distance away from the edges of the pilot holes 18, and the prescribed length is longer than the distance of etching the side faces of the gas purging holes 140. With this structure, the invasion of the etching solution to the plated layers 19 coating the inner faces of the pilot holes 18, so that damaging the plated layers 19 coating the inner face of the pilot holes 18 can be prevented while etching the copper foils 14 and the plated layers 19 coating the surfaces of the base member 16. Therefore, functions of the plated layers 19 coating the inner face of the pilot holes 18 can be secured.

Figure 2A:
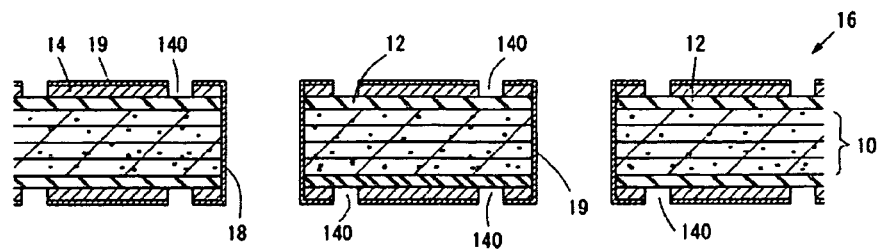
FIGS. 2A and 2B are partial sectional views showing the steps of forming the gas purging holes and filling the pilot holes with resin.

In FIG. 2A, the gas purging holes 140 are formed by etching the plated layers 19 and the copper foils 14 with using the resist patterns 70 as masks. The surfaces of the prepregs 12 are exposed in the gas purging holes 140, and the core section 10 is communicated to the outside of the base member 16 via the gas purging holes 140 so that the core section 10 is communicated to the outside.

Figure 3:
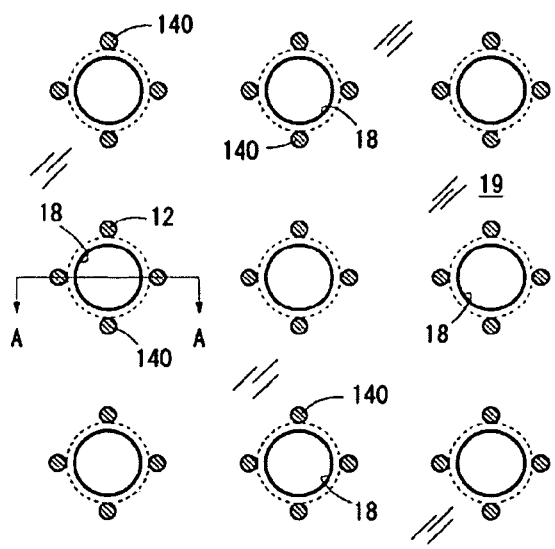
FIG. 3 is a plan view showing an arrangement of the pilot holes and the gas purging holes.

FIG. 3 is a partial plan view of the base member 16, in which the gas purging holes 140 are formed in the surface of the base member 16. The pilot holes 18 penetrating the base member 16 are regularly arranged in a matrix form. Further, four gas purging holes 140 are cruciately arranged around the edge of each of the pilot holes 18. The surfaces of the prepregs 12 are exposed in the gas purging holes 140 as inner bottom faces thereof.

Each of the gas purging holes 140 are separated the distance D from the pilot hole 18. As described above, by separating the gas purging holes 140 from the edges of the pilot holes 18, etching the plated layers 19 coating the inner faces of the pilot holes 18 can be prevented when the copper foils 14 and the plated layers 19 on the base member 16 are etched. The surfaces of the base member 16 are coated with the plated layers 19. Note that, FIG. 2A is a sectional view taken along a line A-A shown in FIG. 3.

The arrangement of the pilot holes 18 bored in the base member 16 is not limited to the matrix form, so they may be arranged optionally. A plurality of the gas purging holes 140 may be provided between the adjacent pilot holes 18, may be radially arranged with respect to each of the pilot holes 18 and may be merely regularly arranged in the surface of the base member 16.

As described above, the gas purging holes 140 are located near the edges of the pilot holes 18 so as to effectively purge the gas and/or water vapor from the parts near the pilot holes 18. If a large number of the gas purging hoes 140 are further formed in the surfaces of the base member 16 other than the parts near the pilot holes 18, the gas and/or water vapor can be easily purged from the core section 10. Further, many asperities, i.e., gas purging holes, are formed in the surfaces of the base member 16, so that bonding strength between the base member 16 and insulating layers, which are formed on the surfaces of the base member 16, can be increased.

Figure 2B:
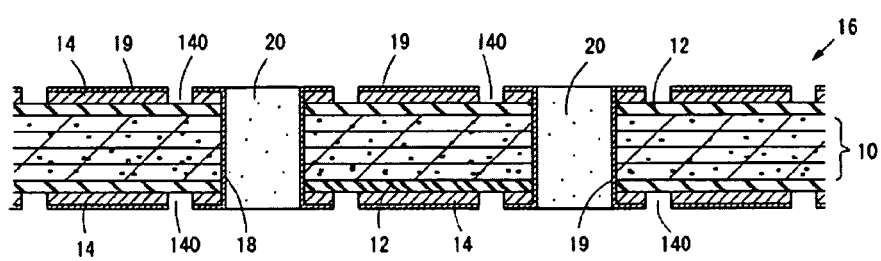

In FIG. 2B, the resin 20 is filled in the pilot holes 18 as insulating materials. The pilot holes 18 can be filled with the resin 20 by screen-printing or using a metal mask.

After filling the pilot holes 18 with the resin 20, the resin 20 is cured by the heating step. In the present embodiment, the resin 20 is thermosetting epoxy resin, and the resin 20 is cured at temperature of about 160° C. Since the gas purging holes 140 are formed in the surfaces of the base member 16, the decomposition gas and/or water vapor generated from the core section 10 can be discharged or purged to the outside via the gas purging holes 140, so that expansion of the plated layers 19 and the copper foils 14 can be prevented.

After heat-curing the resin 20 in the pilot holes 18, ends of the cured resin 20, which are projected outward from the pilot holes 18, are abraded and flattened, so that end faces of the cured resin 20 are made level with the surfaces of the plated layers 19.

Figure 4A:
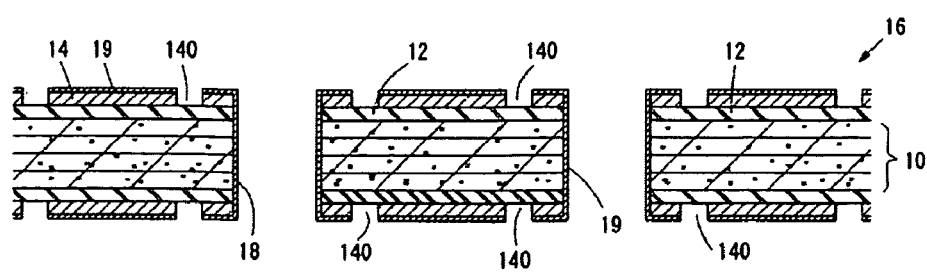
FIGS. 4A-4C are partial sectional views showing another process of producing the gas purging holes and filling the pilot holes with resin.
Figure 4B:
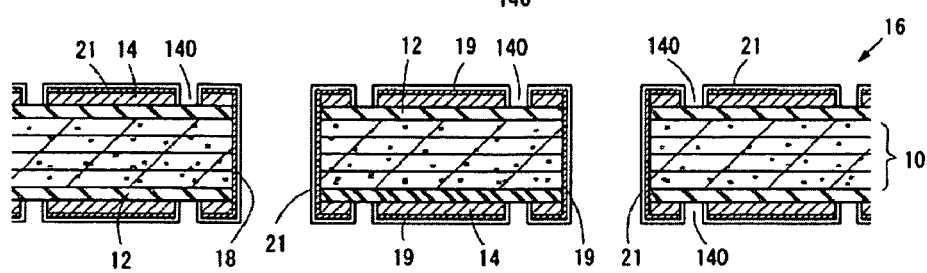

In FIGS. 4A-4B, the inner faces of the pilot holes 18 are coated with the plated layers 19, and then the inner faces of the pilot holes 18 are further coated with insulating films 21.

In FIG. 4A, the pilot holes 18 shown in FIG. 2A are coated with the plated layers 19.

In FIG. 4B, the insulating films 21 are formed on the copper foils 14 and the plated layers 19, which have been formed on the inner faces of the pilot holes 18 and the surfaces of the base member 16, by the electrodeposition method. The plated layers 19 entirely coat the inner faces of the pilot holes 18 and the both side faces of the base member 16. Therefore, the insulating films 21 can be formed on the inner faces of the pilot holes 18 and the entire side faces of the base member 16 by the electrodeposition method, in which the plated layers 19 are used as electric power feeding layers. For example, the insulating films 21 can be electrodeposited by a constant current method, in which the base member is soaked in an electrodeposition solution of epoxy resin and then a direct current is passed through the plated layers 19.

The insulating films 21 are formed to securely prevent short circuit between the pilot holes 18 and the plated through-hole sections.

After electrodepositing the insulating films 21 on the inner faces of the pilot holes 18 and the both side faces of the base member 16, a drying process and a heating process are performed so as to cure the insulating films 21. Thicknesses of the insulating films 21 are 10-20 µm.

Figure 4C:
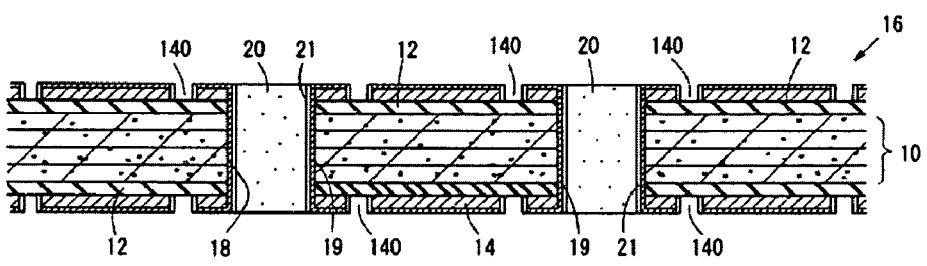

In FIG. 4C, the pilot holes 18, whose inner faces have been coated with the insulating films 21, are filled with the resin 20 as the insulating materials. While heat-curing the resin 20 in the pilot holes 18, the gas generated from the core section and water vapor generated from the base member 16 are discharged to the outside via the gas purging holes 140 formed in the surfaces of the base member 16, so that the problem of expanding the plated layers 19 and the insulating films 21 can be prevented.

After heat-curing the resin 20 in the pilot holes 18, ends of the cured resin 20, which are projected outward from the pilot holes 18, are abraded and flattened. At that time, the insulating films 21 coating the surfaces of the base member 16 are also abraded and removed, and the end faces of the cured resin 20 are made level with the surfaces of the base member 16.

By coating the inner faces of the pilot holes 18 with the plated layers 19, the rough inner faces of the pilot holes 18 can be made smooth, so that no voids are formed in the resin 20 when the pilot holes 18 are filled with the molten resin 20. Therefore, the short circuit between the core section and the plated through-hole sections, which is caused by voids formed in the resin 20, can be effectively prevented. By coating the plated layers 19 with the insulating films 21, the inner faces of the pilot holes 18 are made further smooth, filling rate of the resin 20 can be improved, and the insulating films 21 insulate the pilot holes 18 from the plated through-hole sections so that the short circuit between the core section 10 and the plated thorough-hole sections can be securely prevented.

The core substrate of the present embodiment is produced by: filling the pilot holes 18 bored in the base member 16 with the resin 20 as shown in FIG. 2B or 4C; laminating the cable layers on the both side faces of the base member 16; and forming the plated through-hole sections penetrating the pilot holes 18.

If the thermal expansion coefficient of the core sections 10 of the base member 16 is significantly different from that of the cable layers, the cable layers will separate from the base member 16 or cracks will be formed in boundary faces therebetween. Thus, no electrically conductive members, e.g., copper foils, are provided between the base member 16 and the cable layers. Preferably, the prepregs (resin layers) 12 are exposed in the surfaces of the base member 16, and the insulating layers included in the cable layers are bonded to the insulating layers of the base member 16. In comparison with the case of bonding resin to copper foils, bonding strength between resins (insulating layers) is highly increased.

(Step of Etching Conductive Layers)

Thus, FIGS. 5A-5D show the steps of: coating the surfaces of the base member 16 with dry film resist (photo resist); and removing the copper foils 14 and the plated layers 19, wherein the copper foils 14 and the plated layers 19 having a prescribed width are left along edges of the pilot holes 18.

Figure 5A:
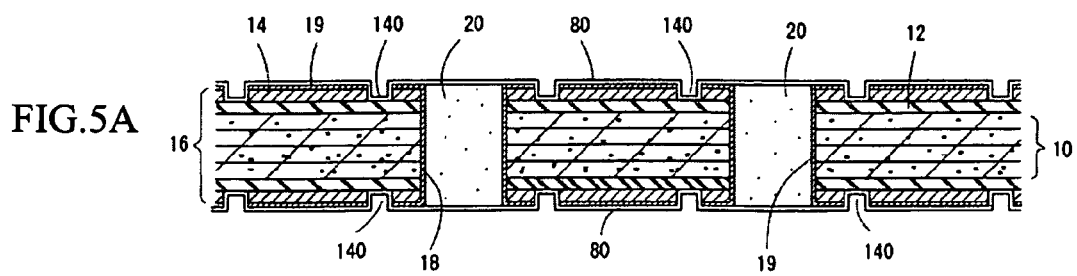

In FIG. 5A, the pilot holes 18 of the base member 16 are filled with the resin 20, and then the surfaces of the base member 16 are coated with copper plated layers 80 by electroless plating.

Figure 5B:
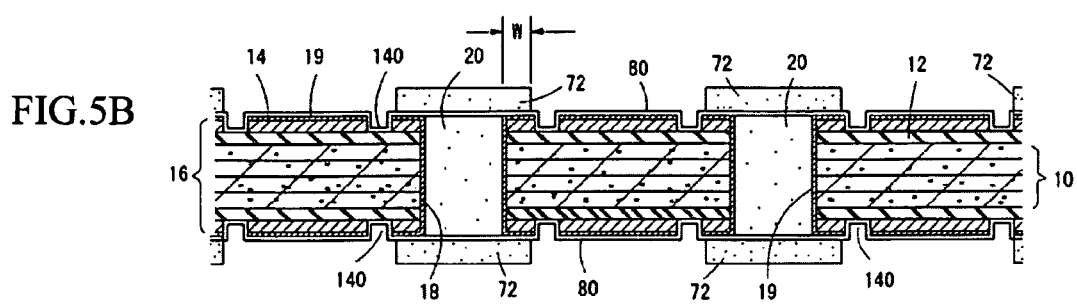

In FIG. 5B, dry film resist (photo resist) is applied on the both side faces of the base member 16, and then the photo resist is optically exposed and developed so as to form resist patterns 72. The resist patterns 72 coat planar areas of the pilot holes 18 and further circularly coat the edges of the pilot holes 18 with a prescribed width.

Figure 5C:
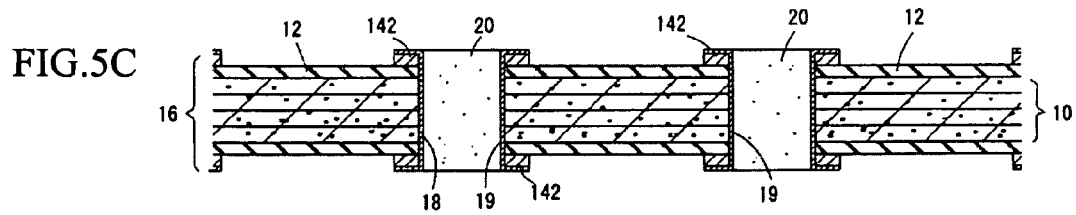
Figure 5C:
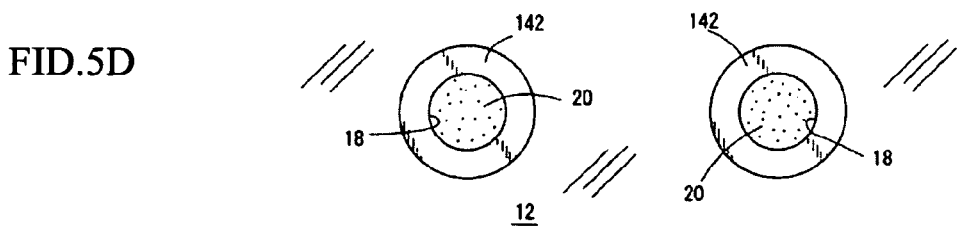

In FIG. 5C, chemical etching is performed with using the resist patterns 72 as masks, so that the copper plated layers 80, the plated layers 19 and the copper foils 14 are removed and partially left.

The resist patterns 72 having the prescribed width coat the pilot holes 18 and the edges thereof. Therefore, by performing the etching with using the resist patterns 72 as masks, the ring-shaped copper foils 14 and the plated layers 19 are partially left along the edges of the pilot holes 18.

In FIG. 5D, the copper foils 14 and the plated layers 19 are left along the edges of the pilot holes 18, so that lands 142 are formed. The prepregs 12 are exposed in the surfaces of the base member 16, and the pilot holes 18 are filled with the resin 20. The end faces of the cured resin 20 in the pilot holes 18 are made level with end faces of the lands 142.

In the step shown in FIG. 5A, the both side faces of the base member 16 are coated by the electroless plating, so that only the resist patterns 72 can be easily removed from the resin 20 cured in the pilot holes 18 when the resist patterns 72 are removed after etching the copper foils 14 and the plated layers 19.

If the dry film resist is applied on the both side faces of the base member 16 without electroless-plating the both side faces of the base member 16, the dry film resist is tightly bonded to the resin 20 because they are resins. Namely, the resist patterns 72 cannot be easily removed from the resin 20 after performing the etching process. If the dry film resist (resist patterns 72) are forcibly peeled or chemically removed from the resin 20, burrs will be formed in the end faces of the resin 20 or the end faces thereof will be damaged.

On the other hand, the surfaces of the base member are previously coated by the electroless copper plating, and then dry film resist is applied thereon. Therefore, the dry film resist (resist patterns 72) can be easily removed by a liftoff procedure or chemically dissolving the copper plated layers 80. By performing the electroless copper plating, the copper plated layers 80 are provided between the end faces of the resin 20 and the resist patterns 72, and the copper plated layers 80 act as release layers.

Thicknesses of the copper plated layers 80 acting as the release layers may be about 0.5-1 μm. The electroless-plated layers acting as the release layers may be composed of not only copper but also other metals. Note that, the electroless copper plating can be easily performed, and copper layers can be easily etched.

As shown in FIG. 5B, in the present embodiment, the dry film resist is patterned so as to leave the copper foils 14 and the plated layers 19, whose width is w, along the edges of the pilot holes 18 when the resist patterns 72 are formed on the both side faces of the base member 16. The copper foils 14 and the plated layers 19 are partially left along the edges of the pilot holes 18 so as not to etch the plated layers 19 coating the inner faces of the pilot holes 18 while etching the copper foils 14 and the plated layers 19. If the resist patterns 72 coat the opening sections of the pilot holes 18 only, an etching solution will invade to the inner faces of the pilot holes 18 and will etch them while etching the copper foils 14 and the plated layers 19.

In FIG. 5B, each of the resist patterns 72 coating the pilot holes 18 is extended the distance w from the edge of the pilot hole 18. In this state, side faces of the lands 142 are etched by chemically etching the copper foils 14 and the plated layers 19. Amount of etching the side face depends on etching conditions, e.g., thicknesses of the copper foils 14 and the plated layers 19, etching solution, injection pressure of an etching solution. The amount of etching the side face is about 70% of the thickness of the layer to be etched. Therefore, the extended distance W of the resist patterns 72 is set, with considering the amount of etching the side faces, so as to prevent the etching solution from reaching the inner faces of the pilot holes 18. Namely, the plated layers 19 coating the inner faces of the pilot holes 18 must be protected.

(Steps of Forming Cable Layers)

FIGS. 6A-7B show the steps of: forming the cable layers on the both side faces of the base member, in which the lands 142 are formed along the edges of the pilot holes 18 by the above described steps; and forming the plated through-hole sections.

Figure 6A:
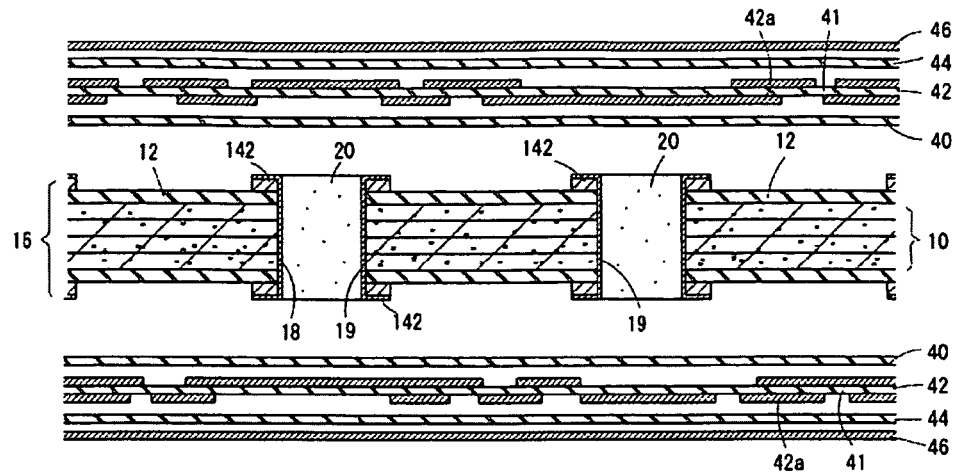
FIGS. 6A-6C are partial sectional views showing the steps of producing another core substrate.

In FIG. 6A, prepregs 40, cable sheets 42, prepregs 44 and copper foils 46 are laminated in this order. Each of the cable sheets 42 is constituted by an insulating resin sheet 41 and cable patterns 42a, which are formed on the both faces of the insulating resin sheet 41. The cable sheet 42 may be formed by etching copper foil layers of a copper-bonded substrate, which is constituted by an insulating resin sheet composed of a glass cloth and copper foils bonded on the both faces of the insulating resin sheet, in prescribed patterns.

Figure 6B:
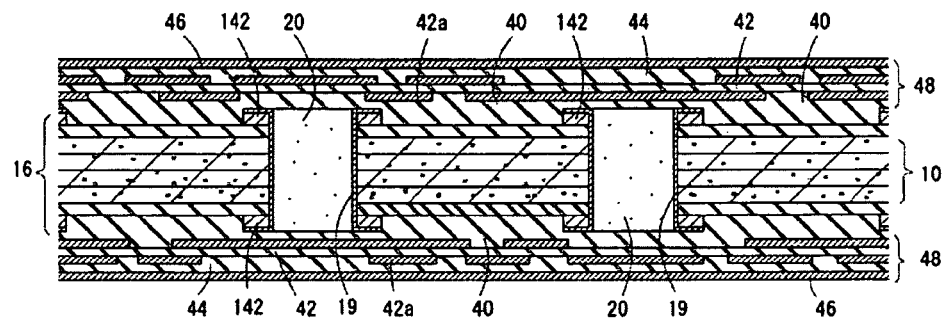

In FIG. 6B, the prepregs 40, the cable sheets 42, the prepregs 44 and the copper foils 46, which have been correctly positioned on the both side faces of the base member 16, are heated and pressurized, so that the prepregs 40 and 44 are cured and cable layers 48 are integrally laminated on the base member 16. The prepregs 40 and 44 are formed by impregnating glass cloths with resin, and the uncured prepregs 40 and 44 are provided between layers. By the heating and pressurizing process, the prepregs 40 and 44 insulate and integrate the cable layers 48.

Figure 6C:
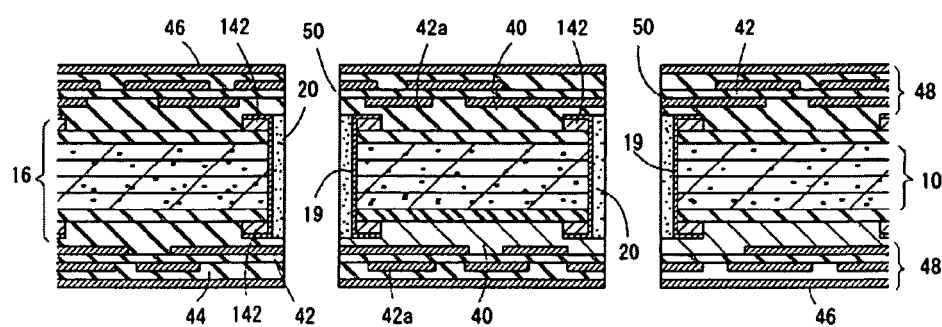

In FIG. 6C, through-holes 50 are bored in the base member 16, on which the cable layers 48 have been laminated, so as to form the plated through-hole sections. The through-holes 50 are coaxial with the pilot holes 18 and bored, by a drill, in the thickness direction of the base member 16, which has been integrated with the cable layers 48. Since diameters of the through-holes 50 are smaller than those of the pilot holes 18, the resin 20 is exposed in the inner faces of the through-holes 50 passing through the resin 20.

Figure 7A:
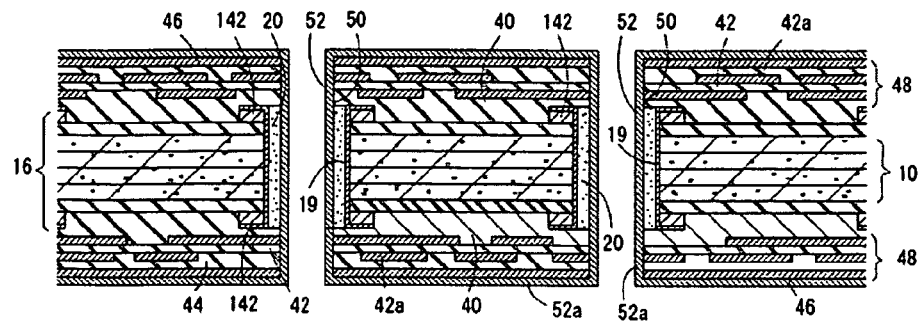
FIGS. 7A and 7B are partial sectional views showing further steps of producing another substrate.

In FIG. 7A, the base member 16 is plated with copper by an electroless plating method and an electrolytic plating method so as to form the plated through-hole sections 52 on the inner faces of the through-holes 50 after forming the through-holes 50. By performing the electroless plating method, the inner faces of the through-holes 50 and the entire surfaces of the base member 16 are coated with copper. Then, the electrolytic plating method is performed with using the copper layer formed by the electroless plating method as electric power feeding layers, so that the inner faces of the through-holes 50 and the entire surfaces of the base member 16 are coated with plated layers 52a. The plated layers 52a formed on the inner faces of the through-holes 50 acts as the plated through-hole sections 52, which mutually connect cable patterns formed on the both side faces of the base member 16.

Figure 7B:
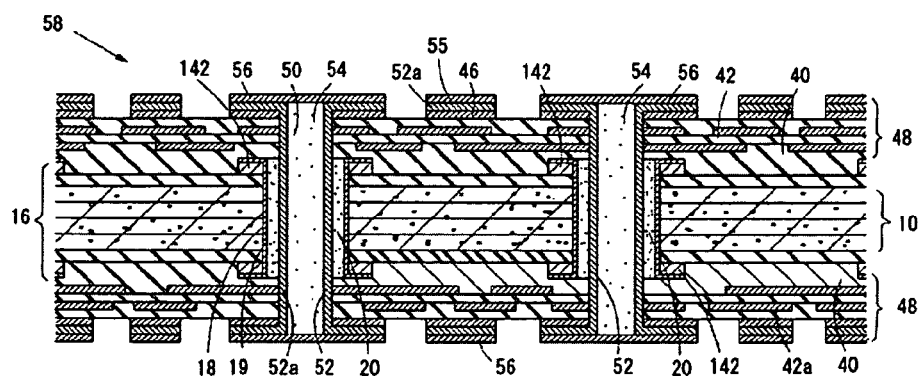

In FIG. 7B, after forming the plated through-hole sections 52, the through-holes 50 are filled with resin 54, cap-plated layers 55 are formed, and then cable patterns 56 are formed by etching the copper foils 46, the plated layers 52a and the cap-plated layers 55, which are formed on the both side faces of the base member, in prescribed patterns, so that the core substrate 58 can be produced.

The cable patterns 56 formed on the both side faces of the core substrate 58 are mutually electrically connected by the plated through-hole sections 52. Further, the inner cable patterns 42a in the cable layers 48 are connected to the plated through-hole sections 52 at suitable positions.

In the core substrate 58, the inner faces of the pilot holes 18, which are formed in the base member 16 including the core section 10, are coated with the plated layers 19, so that the short circuit between the core section 10 and the plated through-hole sections 52 can be prevented.

Figure 8:
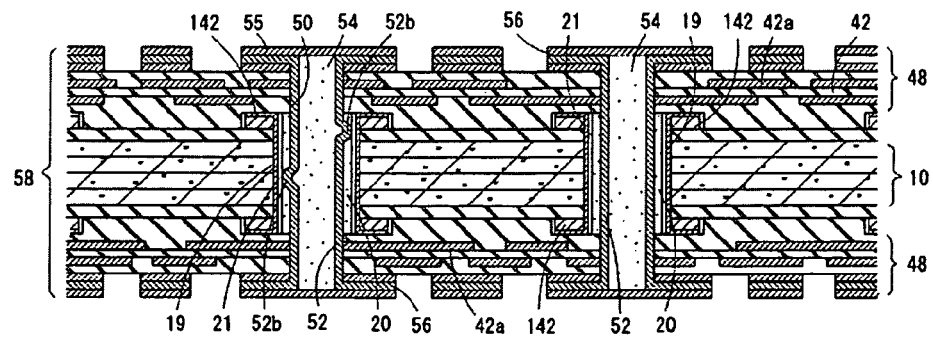
FIG. 8 is a partial sectional view of a modified core substrate.

FIG. 8 shows the core substrate 58 including the base member 16 shown in FIG. 4C, in which the inner faces of the pilot holes 18 are coated with the plated layers 19 and insulating films 21.

In this case too, the core substrate 58 can be produced by laminating the cable layers 48 on the both side faces of the base member 16 as well as the process shown in FIGS. 6A-7B. The cable patterns 56 are formed on the both side faces of the core substrate 58, and the cable patterns 56 are mutually electrically connected by the plated through-hole sections 52.

In the core substrate 58 of the present embodiment, the inner faces of the pilot holes 18 formed in the core section 10 are doubly coated with the plated layers 19 and the insulating films 21, and the insulating films 21 are exposed on the inner faces of the pilot holes 18. Therefore, even if voids are formed in the resin 20 and the voids make expanded parts 52b in the plated through-hole section 52 when the pilot holes 18 are filled with the resin 20, the insulating film 21 exists between the expanded parts 52b and the plated layer 19 so that short circuit between the plated through-hole sections 52 and the core section 10 can be prevented.

(Steps of Producing Circuit Board)

The circuit board can be produced by laminating the cable patterns on the both side faces of the core substrate 58.

Figure 9:
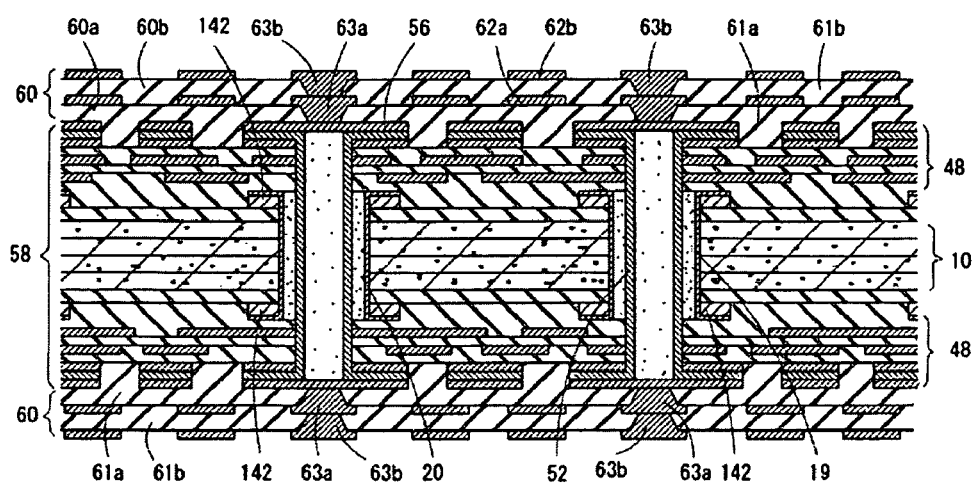
FIG. 9 is a partial sectional view of a circuit board.

In the circuit board shown in FIG. 9, build-up layers 60, each of which is constituted by two build-up layers 60a and 60b, are formed on the both side faces of the core substrate 16 shown in FIG. 7B.

Each of the first build-up layers 60a includes: an insulating layer 61a; a cable pattern 62a formed on a surface of the insulating layer 61a; and vias 63a electrically connecting the lower cable pattern 56 to the upper cable pattern 62a. Each of second build-up layers 60b includes: an insulating layer 61b; a cable pattern 62b; and vias 63b.

The cable patterns 62a and 62b, which are included in the build-up layers 60 formed on the both side faces of the core substrate 58, are mutually electrically connected by the plated through-hole sections 52 and the vias 63a and 63b.

The steps of forming the build-up layers 60 will be explained.

Firstly, insulating layers 61a are formed on the both side faces of the core substrate 58 by laminating insulating resin films, e.g., epoxy film, and via holes, in which the vias 63a will be formed and in which the cable patterns 56 formed on the side faces of the core substrate 58 are exposed, are bored in the insulating layers 61a by laser means.

Next, the inner faces of the via holes are desmear-treated so as to roughen the inner faces thereof, and then the inner faces of the via holes and the surfaces of the insulating layers 61a are coated with copper layers by the electroless plating.

Then, the electroless-plated copper layers are coated with photoresist, and resist patterns, in which parts of the electroless-plated copper layers which will be formed as the cable patterns 62a are exposed, are formed by optically exposing and developing the photoresist.

Further, the electrolytic plating, in which the resist patterns are used as masks and in which the electroless-plated copper layers are used as electric power feeding layers, is performed so as to supply copper to the exposed parts of the electroless-plated copper layers for upraising the copper therein. In this step, the via holes are filled with copper supplied by the electrolytic plating method and the vias 63a are formed.

Next, the resist patterns are removed, and the exposed parts of the electroless-plated copper layers are etched and removed, so that cable patterns 62a are formed, in prescribed patterns, on the surfaces of the insulating layers 61a.

The second build-up layers 60b can be formed as well as the first build-up layers 60a.

Electrodes, to which semiconductor elements will be connected, or connecting pads, to which external connectors will be connected, are patterned in the outermost layers, and the outermost layers other than the exposed parts, e.g., electrodes, connecting pads, are coated with protection films. The exposed electrodes or connecting pads are plated with, for example, gold for protection.

The circuit board may be produced by other methods. The steps of forming the cable layers on the both side faces of the core substrate 58 are not limited to the above described steps.

In the above described embodiments, the base member has the core section 10 composed of electrically conductive carbon fiber-reinforced plastic.

The present invention may be applied to substrates having core sections composed of other electrically conductive materials or core sections composed of resin.

Further, the present invention can be applied to methods including the steps of forming plated layers on inner faces of through-holes and forming resist patterns for preventing the plated layers from being etched.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of producing a core substrate, comprising:
    forming a pilot hole in a base member, the base member including a core section composed of carbon fiber-reinforced plastic, copper foils being bonded on both surfaces of the core section with prepregs;
    coating an inner face of the pilot hole with a plated layer by electroless-plating;
    electrolytic-plating the base member subsequent to the electroless-plating of the inner face of the pilot hole;

filling the pilot hole, whose inner face has been coated with the plated layer, with an insulating material composed of resin;

forming resist patterns, which coat planar areas of the pilot hole and edges of the pilot hole with a prescribed width, on both surfaces of the base member by laminating photoresist thereon and exposing and developing the photoresist;

forming copper foil patterns along the edges of the pilot hole and exposing the prepregs in both surfaces of the core section by etching the copper foils with using the resist patterns as masks;

removing the resist patterns;

integrating cable layers with the base member by successively placing a first additional prepreg, a cable sheet, in which cable patterns are formed on both surfaces of an insulating sheet, a second additional prepreg, and an additional copper foil, on each of the surfaces of the base member, and pressurizing and heating the cable layers to thermally cure the first additional prepregs and the second additional prepregs;

coaxially forming a through-hole, whose diameter is smaller than that of the pilot hole and that penetrates the cable layers and the base member, with the pilot hole so as to expose the insulating material as an inner face;

forming a plated through-hole on the inner face of the through-hole by electroless copper plating and electrolytic copper plating;

filling the through-hole with resin; and etching the additional copper foils so as to form additional cable patterns on the both surfaces of the base member.

2. The method according to claim 1, wherein an insulating film is formed on the plated layer, which has been formed on the inner face of the pilot hole, by an electrodeposition method using the plated layer as an electric power feeding layer, the forming of the insulating layer being performed subsequent to the electrolytic-plating of the base member and prior to the filing of the pilot hole.

3. The method according to claim 1, wherein both surfaces of the base member are electroless-copper-plated after the filing of the pilot hole so as to coat both surfaces of the base member with electroless copper plated layers.

4. A method of producing a circuit board, comprising:

producing a core substrate according to the method of claim 1; and laminating cable layers on both surfaces of the core substrate.

5. The method according to claim 4, wherein the cable layers are formed by build-up method.

* * * * *

UNITED STATES PATENT AND TRADEMARK OFFICE
CERTIFICATE OF CORRECTION

| | |
|---|---|
| PATENT NO. | : 8,151,456 B2 |
| APPLICATION NO. | : 12/175732 |
| DATED | : April 10, 2012 |
| INVENTOR(S) | : Yasutomo Maehara et al. |

It is certified that error appears in the above-identified patent and that said Letters Patent is hereby corrected as shown below:

Column 14, Line 11, In Claim 2, delete "filing" and insert -- filling --, therefor.

Column 14, Line 15, In Claim 3, delete "filing" and insert -- filling --, therefor.

Signed and Sealed this
Tenth Day of July, 2012

David J. Kappos
*Director of the United States Patent and Trademark Office*